United States Patent [19]

Davis et al.

[11] 4,349,692
[45] Sep. 14, 1982

[54] GLASS HERMETIC SEAL

[75] Inventors: Earl K. Davis, Tempe; Robert W. Hey, Mesa, both of Ariz.

[73] Assignee: Motorola, Inc., Schaumburg, Ill.

[21] Appl. No.: 279,131

[22] Filed: Jun. 30, 1981

Related U.S. Application Data

[62] Division of Ser. No. 237,001, Feb. 23, 1981, Pat. No. 4,309,507.

[51] Int. Cl.³ .............................................. H01L 23/08
[52] U.S. Cl. ................................ 174/52 H; 65/59.31; 65/59.35; 174/50.61
[58] Field of Search .................. 65/59.3, 59.31, 59.35; 501/21, 66, 70; 174/50.61, 52 H, 52 S

[56] References Cited

U.S. PATENT DOCUMENTS 3,176,201 3/1965 Dickson, Jr. et al. ......... 65/59.31 X
3,356,466 12/1967 Wildeboer et al. .......... 174/50.61 X
4,128,697 12/1978 Simpson ................................ 501/67

Primary Examiner—Arthur D. Kellogg
Attorney, Agent, or Firm—Robert M. Handy

[57] ABSTRACT

An improved sealing glass composition for making compression glass electrical feedthroughs in semiconductor device packages is described wherein the improved sealing glass consists essentially of (by weight percent) 63–68% $SiO_2$, 3–6% $Al_2O_3$, 8–9% $K_2O$, 5–6% $Na_2O$, 0.5–1.5% $Li_2O$, 2–4% BaO, 5–7% SrO, 2–4% CaO, 0.5–1.5% MgO, 0.5–1.5% $TiO_2$, and 0.5–1.5% $B_2O_3$.

4 Claims, 2 Drawing Figures

GLASS HERMETIC SEAL

This is a division, of application Ser No. 237,001, filed Feb. 23, 1981 now U.S. Pat. No. 4,309,507.

BACKGROUND OF THE INVENTION

This invention relates to glass compositions for use in encapsulating electronic devices and, more particularly, to glass compositions having controlled expansion properties which can be used in glass compression seals for insulating the electrical leads of semiconductor device packages.

Insulating glasses which melt at temperatures exceeding 500° C. are conveniently used to provide insulated electrical feedthroughs in the walls of many semiconductor device enclosures. The glass serves to insulate the electrical lead from the body of the device enclosure, and at the same time to prevent the ingress of atmospheric contaminants into the interior of the enclosure where they might adversely affect the reliability of the semiconductor device contained therein. Leads sealed so as to be impervious to atmospheric contaminants are said to be "hermetic."

Compression glass seals are a well-known technique for providing hermetic insulating feedthroughs in electrical enclosures, particularly semiconductor device enclosures. In order to insure that all parts of the seal remain in compression, the coefficient of expansion of the lead is generally chosen to be less than the coefficient of expansion of the glass surrounding the lead, which is in turn chosen to have a coefficient of expansion substantially less than the coefficient of expansion of the portion of the encapsulation body which surrounds the glass. In a typical example of the prior art, a compression glass seal is made using 52-Alloy for the central lead, surrounded by Corning #9013, 9048, or 9155 sealing glass which is inset in a mild (1010-Alloy) steel base. Hermetic compression glass seals are obtained using these combinations of materials. SHOTT 8421 glass manufactured by the Jenaer Glaswerk is another example of a prior art sealing glass suitable for use with 52-Alloy leads and 1010-Alloy bases. 52-Alloy and 1010-Alloy are American National Standard designations defined in ANSI/ASTM Standard Specification F30-77 and A29-79 respectively. These materials are well known per se in the art.

It has been found, however, that compression glass seals made according to the prior art are not sufficiently rugged for effective use in semiconductor devices which may be subjected to rough handling, a condition often encountered during the latter stages of manufacturing. For example, TO-3 type semiconductor packages have a mild steel base in which are inset two or more compression glass seals for the two insulated leads to be connected to the semiconductor die placed on the base of the package. During assembly, these leads frequently become bent and must be straightened one or more times before manufacturing is completed. It has been observed that the hermeticity of the seal between the electrical leads and the glass is seriously degraded by bending and straightening, so that the probability of having a non-hermetic device package increases significantly depending upon the number of times that the leads have been bent and straightened. This property reduces both the manufacturing yield and the field reliability. Improper selection of the relative coefficient of expansion of the different parts of the seal, particularly the sealing glass, is believed to be a significant cause of the tendency to lose heremticity following one or more lead bending and straightening operations.

Accordingly it is an object of the present invention to provide an improved glass composition for the fabrication of compression glass seals and electrical devices.

It is a further object of this invention to provide a sealing glass composition with improved thermal expansion properties.

Another object of this invention is to provide an improved method for making hermetic seals for electrical devices.

It is an additional object of this invention to provide a semiconductor device encapsulation of improved properties, particularly the ability to withstand rough handling and multiple lead bending-straightening operations without loss of hermeticity.

SUMMARY OF THE INVENTION

In accordance with the present invention there is provided a compression sealing glass of controlled expansion consisting essentially of the following (in weight percent):

| Material | Composition Range |
| --- | --- |
| $SiO_2$ | 63–68 |
| $Al_2O_3$ | 3–6 |
| $K_2O$ | 8–9 |
| $Na_2O$ | 5–6 |
| $Li_2O$ | 0.5–1.5 |
| BaO | 2–4 |
| SrO | 5–7 |
| CaO | 2–4 |
| MgO | 0.5–1.5 |
| $TiO_2$ | 0.5–1.5 |
| $B_2O_3$ | 0.5–1.5 |

Improved electrical enclosures having hermetic insulated leads are provided by use of the above listed glass composition.

Further, improved sealing properties and improved electrical device enclosures with hermetic insulated leads are obtained by using sealing glass compositions which provide interfacial tensile stress values of 0–2000 psi (0–14.0 MPa) measured in a fusion couple formed from the sealing glass and a sample of the lead metal.

DETAILED DESCRIPTION OF THE PREFERRED EMBODIMENTS

Figure 1:
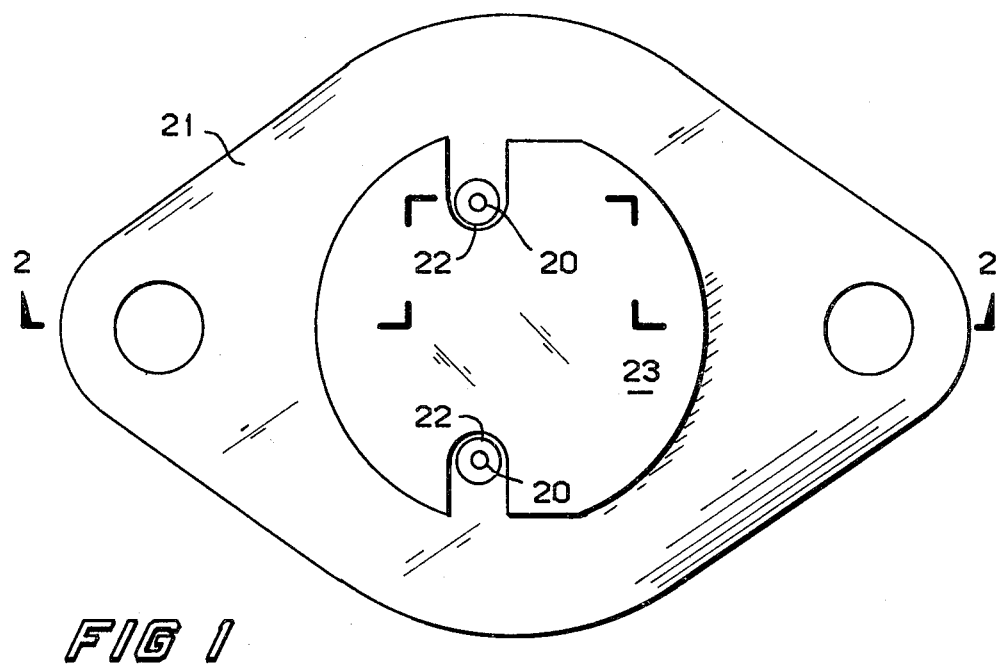
FIG. 1 is a top view of a TO-3 type of semiconductor device package showing the base portion in which two compression glass sealed insulated electrical leads are installed.
Figure 2:
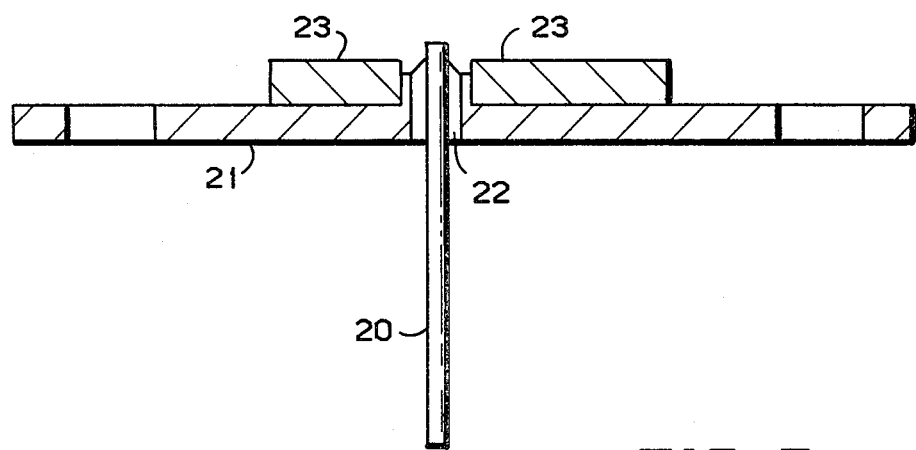
FIG. 2 is a cross-section of the device of FIG. 1 showing the details of a compression glass seal.

FIGS. 1–2 show the arrangement and construction details of a typical TO-3 type semiconductor package base including two insulated electrical leads formed by means of compression glass seals. Leads 20 of 52-Alloy are installed in base 21 of 1010-Alloy steel by means of compression seal glass 22. Heat spreader 23 is customarily made of copper, but aluminum, molybdenum, ceramic, or combinations of heat conductive materials are useful. A semiconductor die (not shown) is attached to heat spreader 23 and electrically connected to leads 20. Encapsulation is completed by welding a hat-shaped lid (not shown) onto base 21 over heat sink 23 or by covering the device, heat sink, and leads with a plastic material. The means of encapsulation is not important to this invention.

The ability of the above-described package to withstand rough handling was tested by taking hermetic packages, bending and straightening the leads, and retesting for hermeticity, this procedure being repeated until loss of hermeticity occurred. The leads were bent by hand to angles of approximately 30 and 45 degrees. Table 1 shows the collective results of lead-bend tests performed on devices of the prior art as well as devices utilizing the new glass compositions of the present invention. Packages built with the glass compositions of the present invention are able to withstand more bending-straightening operations and show a lower percentage of leaking pins than those of the prior art.

TABLE 1

|  | Number of Bends to Produce Leaks (Average) | Percentage of Pins Which Leak (Average) |
|---|---|---|
| Bend Angle Approximately 45° | | |
| Prior Art Glass | 3.5 | 50% |
| New Glass | 4.3 | 35% |
| Bend Angle Approximately 30° | | |
| Prior Art Glass | 4.0 | 58% |
| New Glass | 8.2 | 35% |

In addition to having a high resistance to loss of hermeticity caused by lead-bending and straightening, it is desirable that the sealing glass exhibit the following properties:

(a) Have a sealing temperature range such that seals can be made in production belt furnaces with peak temperatures about 1000° C.;
(b) exhibit good resistance to attack by moisture in order to avoid degeneration during storage or use in human environments;
(c) possess sufficient strength and thermal shock resistance to meet standard commercial and military specifications for these parameters;
(d) be resistant to reducing atmospheric conditions that may be encountered during sealing;
(e) be resistant to devitrification so that the glass remains fully vitreous during sintering and sealing operatings;
(f) have a suitable coefficient of expansion to complement the metal subcomponents.

A glass composition has been discovered which meets the above requirements. Table 2 lists the glass composition of the present invention in weight percent.

TABLE 2

| Element | Range of Composition |
|---|---|
| $SiO_2$ | 63–68 |
| $Al_2O_3$ | 3–6 |
| $K_2O$ | 8–9 |
| $Na_2O$ | 5–6 |
| $Li_2O$ | 0.5–1.5 |
| BaO | 2–4 |
| SrO | 5–7 |
| CaO | 2–4 |
| MgO | 0.5–1.5 |
| $TiO_2$ | 0.5–1.5 |
| $B_2O_3$ | 0.5–1.5 |

Several examples of the new improved compression sealing glass and their physical characteristics are shown in Table 3 following:

TABLE 3

|  | Example A | Example B | Example C | Example D | Example E |
|---|---|---|---|---|---|
|  | Weight Percent Composition of the Melt | | | | |
| $SiO_2$ | 65.5 | 65.5 | 65.5 | 66.16 | 65.72 |
| $Al_2O_3$ | 4.0 | 4.5 | 4.5 | 4.04 | 4.54 |
| $K_2O$ | 9.0 | 8.5 | 8.2 | 8.33 | 8.27 |
| $Na_2O$ | 6.0 | 5.5 | 5.2 | 5.81 | 5.34 |
| $Li_2O$ | 1.0 | 1.0 | 1.0 | 1.01 | 1.01 |
| BaO | 3.0 | 3.0 | 3.0 | 3.03 | 3.02 |
| SrO | 6.0 | 6.0 | 6.0 | 6.06 | 6.05 |
| CaO | 3.0 | 3.0 | 3.0 | 3.03 | 3.02 |
| MgO | 1.0 | 1.0 | 1.0 | 1.01 | 1.01 |
| $TiO_2$ | 1.0 | 1.0 | 1.0 | 1.01 | 1.01 |
| $B_2O_3$ | 0.5 | 1.0 | 1.6 | .51 | 1.01 |
|  | 100.0 | 100.0 | 100.0 | 100.00 | 100.00 |
| Expansion X $10^{-7}/°C$. (average 0–300° C.) | 92 | 85 | 84 (est.) | 87 | 86 |
| Strain Point ($10^{14.5}$ poises, $10^{13.5}$ Pa.s) | 464° C. | | | | 475° C. |
| Anneal Point ($10^{13.0}$ poises, $10^{12}$ Pa.s) | 506° C. | | | | 518° C. |
| Softening Point ($10^{7.6}$ poises, $10^{6.6}$ Pa.s) | 692° C. | | | | 706° C. |
| Working Point ($10^4$ poises, $10^3$ Pa.s) | 1004° C. | | | | 1022° C. |
| Density (grams per $cm^3$) | 2.59 | 2.58 | | | 2.60 |
| Number of Leads-Bends to Produce Hermeticity Failure | | | | | |
| Bend Angle About 45° | 3 | 4–6 | 4 | 4 | — |
| Bend Angle About 30° | — | 7–11 | — | — | 7–10 |

Specific glass melt compositions B and E gave the best overall results and are preferred. The weight percentages given in Table 3 are determined by calculation based on the starting material.

To manufacture a glass corresponding to the composition of example B in Table 3, the quantities of raw materials shown in Table 4 were used for a 600 gram melt. Gaseous by-products (e.g. $CO_2$, $H_2O$, $O_2$, $N_2$, $N_2O$, NO, $N_2O_3$, etc.) evolved during melting account for the difference between the starting weight (733.3 grams) and the final weight (600 grams) of the melt. The weight of these gaseous by-products is substracted from the charge weight to determine the melt composition shown in Table 3.

TABLE 4

| Raw Material | Weight in Grams |
|---|---|
| $SiO_2$ (sand) | 393.0 |
| $Al(OH)_3$ (Aluminum Hydrate) | 41.3 |
| $K_2CO_3$ | 74.8 |
| $Na_2CO_3$ | 30.8 |
| $NaNO_3$ | 41.1 |
| $Li_2CO_3$ | 14.8 |
| $BaCO_3$ | 23.2 |
| $SrCO_3$ | 51.3 |
| $CaCO_3$ | 32.1 |
| 4 $MgCO_3 \cdot Mg(OH)_2 \cdot n\, H_2O$ (Magnesium Carbonate) | 14.3 |
| $TiO_2$ | 6.0 |

TABLE 4-continued

| Raw Material | Weight in Grams |
|---|---|
| $H_3BO_3$ (Boric Acid) | 10.6 |
| TOTAL | 733.3 |

This material was melted in a platinum crucible having a diameter and height of three inches (7.62 cm). The crucible and approximately one-fourth of the mixed ingredients were heated to 1500° C. in a laboratory Glowbar furnace. After a period of 15 minutes an additional one-fourth of the powdered material was added, this procedure being repeated until the entire batch was melted within the crucible. The molten glass was stirred with a platinum impeller at 90 revolutions per minute for one half hour, allowed to rest for one hour so that entrained gas bubbles might escape, and then stirred again for one half hour. The final stirring is desirable to insure melt homogeneity.

The crucible was then removed from the furnace and a portion of the glass quickly poured into water to produce glass in frit form. Other portions were poured into various molds to provide slabs or disks for test purposes. The glass frit is used as a starting material for preparation, by methods well-known per se in the art, of glass pre-forms used for the assembly of compression seals. Other melting and mixing techniques, such as continuous feeding may be used as well. Example E of Table 3 is a 91 kilogram melt prepared by continuous feed techniques.

The finished glass seals are expected to have a slightly different actual composition than the original melts listed in Table 3 due to losses of volatile constituents, mainly alkalies. The volatile constituent loss may be as much as 1% for total alkalies (i.e. $K_2O + Na_2O + Li_2O$), but decreases as the size of the melt increases.

Glass frits of the above-described compositions were made into pre-forms and these sealed into standard TO-3 headers using a standard belt furnace and a reducing or inert atmosphere by methods well-known per se in the art. The maximum sealing temperature was about 1000° C. with a duration of about 10 minutes above 950° C. and the procedure was substantially identical to the procedure used for the preparation of the prior art devices. The leads were subjected to bends of 30 or 45 degrees, hand-straightened, and the devices tested for hermeticity. This procedure was repeated until loss of hermeticity was detected. The results are given in Tables 1 and 3.

In addition to lead-bend tests, samples of the glass were used to prepare a series of fusion couples, each consisting of a small slab of glass fused at a temperature above the glass softening point to a matching but thinner slab of 52-Alloy. Typical slab dimensions were width and length of approximately 1×2 cm, neither of which is particularly critical, and thickness approximately in the range 0.2 to 0.8 cm with 0.5 cm preferred for the glass, and 0.05 to 0.8 cm with 50 mils (0.13 cm) preferred for the metal.

Using a standard laboratory polarimeter and methods well known per se in the art, the magnitude and direction of the stress in the glass at the glass-metal interface could be calculated from the observed birefringence in the glass at the interface. It was found that there was a direct correlation between the interfacial stress values determined in this way and the occurrence of hermeticity problems in the TO-3 headers. When the fusion couple tests showed the interfacial glass region to be in compression, then severe lead-bend hermeticity problems were encountered. Acceptable lead-bend hermeticity results were obtained when fusion-couple tests using couples of the preferred dimensions showed the interfacial glass region to be under tensile stress of 0–2000 psi (0–14.0 MPa) with 1000 psi (6.9 MPa) being a preferred value. For interfacial tension values exceeding 2000 psi (14.0 MPa) the seals tended to crack during thermal cycling. Thus, an optimum range of interfacial stress values has been discovered, and the glass compositions can be adjusted accordingly in order to produce residual stress values in this range. For the glass to be in tension in this situation, the effective coefficient of expansion of the glass between the set point and room temperature has to be greater than that of the lead material, e.g. 52-Alloy in these tests. This is an unexpected result, since this is contrary to the relative coefficient values deduced from bulk samples. The coefficients of expansion measured on bulk samples of the glass as shown in Table 3 are consistently less than the coefficient of expansion of 52-Alloy ($98.5 \pm 2.5 \times 10^{-7}$ per °C.), and are slightly lower but not greatly different from the values typically observed for commercial prior art glasses ($88.5 \pm 2.0 \times 10^{-7}$ per °C.). Based on bulk coefficient of expansion values one would expect eh glass to be in compression in the fusion couple.

Bulk coefficient of expansion values are normally obtained by dialotometer measurements over the range 25°–300° C. The fusion couple, however, measures the effective coefficient of expansion between the annealing or set point of the glass (e.g. approximately 500° C.) and room temperature (e.g. 25° C.), and is thus a more sensitive and more useful indicator of the actual conditions to be found in the compression seal. By using fusion couples as described herein, one can better chose glass compositions having the proper expansion coefficient to give a desired range of tensile stress in the interface with a lead material. With other lead materials, e.g. Kovar, a different range of acceptable interfacial stress is expected which can be determined by experiment. Some seals have been successfully made using the invented glass composition with Kovar leads.

Thus it is apparent that there has been provided in accordance with this invention an improved glass composition for compression glass seals, a glass composition of improved thermal expansion properties, an improved method for making glass compression seals, and improved semiconductor device encapsulation with glass compression seals able to withstand rough handling and multiple lead bending-straightening operations without loss of hermeticity.

Having thus described the invention it will be obvious to those of skill in the art that various modifications can be made within the spirit and scope of the present invention. It is intended to encompass all such variations as fall within the spirit and scope of the invention.

We claim:
1. In a method for making an electrical device having one electrically conductive member hermetically sealed to another member by a glass, the improvement comprising:
utilizing a glass characterized by tensile stress in said glass as measured with a fusion couple comprising said glass and the material of which said conductive member is made, and wherein said glass consists essentially of the following ingredients by weight percent,

SiO$_2$:63–68
Al$_2$O$_3$:3–6
K$_2$O:8–9
Na$_2$O:5–6
Li$_2$O:0.5–1.5
BaO:2–4
SrO:5–7
CaO:2–4
MgO:0.5–1.5
TiO$_2$:0.5–1.5
B$_2$O$_3$:0.5–1.5.

2. An enclosure for an electrical device comprising:
a portion of said enclosure defining at least one aperture;
at least one electrically conductive lead positioned within said aperture;
means within said aperture and surrounding said at least one lead for sealing said aperture, said means comprising a glass characterized by tensile stress in said glass as measured in a fusion couple comprising said glass and the material of which said at least one lead is made; and
wherein said means for sealing said aperture comprises an insulating sealing glass of composition consisting essentially of the following ingredients by weight percent,
SiO$_2$:63–68
Al$_2$O$_3$:3–6
K$_2$O:8–9
Na$_2$O:5–6
Li$_2$O:0.5–1.5
BaO:2–4
SrO:5–7
CaO:2–4
MgO:0.5–1.5
TiO$_2$:0.5–1.5
B$_2$O$_3$:0.5–1.5.

3. An enclosure for an electrical device comprising:
a portion of said enclosure defining at least one aperture;
at least one electrically conductive lead positioned within said aperture;
a semiconductor chip mounted within said enclosure and electrically connected to said at least one electrically conductive lead;
means within said aperture and surrounding said at least one lead for sealing said aperture, said means comprising a glass characterized by tensile stress in said glass as measured in a fusion couple comprising said glass and the material of which said at least one lead is made; and
wherein said means for sealing said aperture comprises an insulating sealing glass of composition consisting essentially of the following ingredients by weight percent,
SiO$_2$:63–68
Al$_2$O$_3$:3–6
K$_2$O:8–9
Na$_2$O:5–6
Li$_2$O:0.5–1.5
BaO:2–4
SrO:5–7
CaO:2–4
MgO:0.5–1.5
TiO$_2$:0.5–1.5
B$_2$O$_3$:0.5–1.5.

4. An enclosure for an electrical device comprising:
a mounting base of shape and dimensions corresponding substantially to the shape and dimensions of a TO-3 type enclosure base and having therein at least one aperture;
at least one electrically conductive lead positioned within said aperture;
a semiconductor chip positioned on said mounting base and electrically connected to said at least one electrically conductive lead;
means within said aperture and surrounding said at least one lead for sealing said aperture, said means comprising a glass characterized by tensile stress in said glass as measured in a fusion couple comprising said glass and the material of which said at least one lead is made; and
wherein said means for sealing said aperture comprises an insulating sealing glass of composition consisting essentially of the following ingredients by weight percent,
SiO$_2$:63–68
Al$_2$O$_3$:3–6
K$_2$O:8–9
Na$_2$O:5–6
Li$_2$O:0.5–1.5
BaO:2–4
SrO:5–7
CaO:2–4
MgO:0.5–1.5
TiO$_2$:0.5–1.5
B$_2$O$_3$:0.5–1.5.

* * * * *